US008906457B2

(12) United States Patent
Thompson et al.

(10) Patent No.: US 8,906,457 B2
(45) Date of Patent: Dec. 9, 2014

(54) METHOD OF ATOMIC LAYER DEPOSITION USING METAL PRECURSORS

(75) Inventors: David Thompson, San Jose, CA (US); Jeffrey W. Anthis, San Jose, CA (US); Christian Dussarrat, Newark, DE (US); Clement Lansalot-Matras, Seoul (KR)

(73) Assignee: Applied Materials, Inc., Santa Clara, CA (US)

( * ) Notice: Subject to any disclaimer, the term of this patent is extended or adjusted under 35 U.S.C. 154(b) by 197 days.

(21) Appl. No.: 13/549,910

(22) Filed: Jul. 16, 2012

(65) Prior Publication Data

US 2013/0059077 A1 Mar. 7, 2013

Related U.S. Application Data

(60) Provisional application No. 61/510,604, filed on Jul. 22, 2011, provisional application No. 61/581,695, filed on Dec. 30, 2011.

(51) Int. Cl.
*C23C 16/18* (2006.01)
*C23C 16/455* (2006.01)

(52) U.S. Cl.
CPC ........... *C23C 16/18* (2013.01); *C23C 16/45553* (2013.01)
USPC ............................................. 427/250; 117/84

(58) Field of Classification Search
USPC ............................................. 427/250; 117/84
See application file for complete search history.

(56) References Cited

U.S. PATENT DOCUMENTS

| | | | |
|---|---|---|---|
| 6,984,581 B2* | 1/2006 | Wong | 438/623 |
| 2005/0227007 A1 | 10/2005 | Bradley et al. | |
| 2005/0240028 A1* | 10/2005 | Grushin | 548/561 |
| 2006/0063898 A1 | 3/2006 | Inoue et al. | |
| 2008/0241575 A1 | 10/2008 | Lavoie et al. | |
| 2008/0305260 A1 | 12/2008 | Shenai-Khatkhate et al. | |
| 2009/0004385 A1* | 1/2009 | Blackwell et al. | 427/250 |
| 2009/0205968 A1 | 8/2009 | Thompson et al. | |
| 2009/0208637 A1 | 8/2009 | Chen et al. | |
| 2010/0021747 A1 | 1/2010 | Dussarrat et al. | |
| 2010/0095865 A1* | 4/2010 | Xu et al. | 106/1.21 |
| 2010/0119406 A1 | 5/2010 | Dussarrat et al. | |
| 2011/0070380 A1 | 3/2011 | Shero et al. | |
| 2011/0101471 A1 | 5/2011 | Kochupurackal et al. | |
| 2012/0108062 A1* | 5/2012 | Anthis et al. | 438/681 |
| 2012/0231164 A1* | 9/2012 | Thompson et al. | 427/252 |
| 2012/0308739 A1* | 12/2012 | Lansalot-Matras et al. | 427/569 |
| 2013/0295298 A1* | 11/2013 | Gatineau et al. | 427/576 |

FOREIGN PATENT DOCUMENTS

| | | |
|---|---|---|
| JP | 2001-261639 | 9/2001 |
| KR | 2010/0013832 | 2/2010 |
| WO | WO-2010/010538 | 1/2010 |
| WO | WO 2010/012595 * | 2/2010 |

OTHER PUBLICATIONS

Vidjayacoumar, Balamurugan, et al., "Investigation of AlMe3, BEt3, and ZnEt2 as Co-Reagents for Low-Temperature Copper Metal ALD/Pulsed-CVD". Chem. Mater. 2010, 22, 4844-4853.*
Dey, Gangotri, et al., "Mechanism for the Atomic Layer Deposition of Copper Using Diethylzinc as the Reducing Agent: A Density Functional Theory Study Using Gas-Phase Molecules as a Model". J. Phys. Chem. A 2012, 116, 8893-8901.*
"International Search Report and Written Opinion", mailed on Feb. 26, 2013, 12 pages.
Disclosed Anonymously, *Mixed [Pyrroles-2-Aldiminate]/ [Cyclopentadienyl] Transition Metal Precursors for Deposition of Transition Metal Containing Films for Various Applications* Sep. 21, 2009, 9 pgs.
PCT International Search Report and Written Opinion in PCT/US2012/047694, dated Feb. 1, 2013, 6 pages.
PCT International Search Report and Written Opinion in PCT/US2012/047698, dated Feb. 1, 2013, 6 pages.
PCT International Search Report and Written Opinion in PCT/US2012/047711, dated Feb. 5, 2013, 6 pages.
Aboaf, J.A., et al., Properties of Transition Metal-Metalioid Ferromagnetic Thin Films, *IEEE Transactions on Magnetics*, vol. MAG-14 No. 5 Sep. 1976, 941-943.
Amemiya, Kensuke, et al., High energy aluminum ion implantation using a variable energy radio frequency quadrupole implanter, *J. Vac. Sci. Technol. A* vol. 16 No. 2 Mar./Apr. 1998, 472-476.
Arnaiz, Ana, et al., Synthesis, Structural Preference and Catalytic Activity of Neutral and Cationic Methylpalladium(II) Complexes Containing N-Arylpyridine-2-Carbarldimine Chelating Ligands, *Collect. Czech. Chem. Commun.* vol. 67 2002, 1200-1214.
Buckley, Donald H., et al., NASA Technical Note: Adhesion and Friction of Thin Metal Films, *NASA Scientific and Technical Publications*, Washington D.C., NASA IN D-8230 Apr. 1976, 20 pages.
Chakravorty, A., et al., Identification of the Geometrical Isomers of Some Tris-Chelate Cobalt(III) Complexes by Nuclear Resonance, *Inorganic Chemistry* vol. 3 No. 11 Nov. 1964, 1521-1524.
Costes, J.P., et al., Geometrical and Optical Isomers of the Nickel(II) Complexes of Chiral, Tetradentate Unmixed and Mixed Schiff Bases; CD and NMR Spectroscopic Studies, *Polyhedron* vol. 14 No. 15-16 1995, 2179-2187.
Felch, S.B., et al., Plasma doping for the fabrication of ultra-shallow junctions, *Surface and Coatings Technology* vol. 156 2002, 229-236.
Gomes, Clara S., et al., Octahedral Co(III) complexes of 2-(phenylimino)pyrrolyl ligands: Synthesis and structural characterisation, *Inorganica Chimica Acta* vol. 367 No. 1 2011, 151-157.
Grushin, Vladimir V., et al., Water as an Ideal Solvent for the Synthesis of Easily Hydrolyzable Compounds: High-Yield Preparation of 2-Pyrrolecarbaldimines and their CVD/ALD-Relevant Cu(II) Derivatives in H2O, *Adv. Synth. Catal.* vol. 346 2004, 1457-1460.
Holm, R.H., et al., The Synthesis, Structures, and Solution Equilibria of Bis(pyrrole-2-aldimino)metal(II) Complexes, *Inorganic Chemistry* vol. 5 No. 4 Apr. 1966, 625-635.

(Continued)

*Primary Examiner* — Bret Chen
(74) *Attorney, Agent, or Firm* — Servilla Whitney LLC

(57) ABSTRACT

Methods for deposition of metal films consisting essentially of Co, Mn, Ru or a lanthanide on surfaces using metal coordination complexes are provided. The precursors used in the process include a 2-methylimine pyrrolyl ligand and/or N,N'-diisopropylformamidinato ligand. The precursors may also contain cyclopentadienyl, pentamethylcyclopentadienyl or pyrrolyl groups.

20 Claims, No Drawings

(56) References Cited

OTHER PUBLICATIONS

Iverson, Carl N., et al., C—H Bond Activation by Unsymmetrical 2-(N-Arylimino)pyrrolide Pt Complexes: Geometric Effects on Reactivity, *J. Am. Chem. Soc.* vol. 125 2003, 12674-12675.

Matsui, Shigekazu, et al., Efficient ethylene polymerisation catalysis by a cationic benzyl hafnium complex containing pyrrolide-imine ligands, *J. Chem. Soc. Dalton Trans.* 2002, 4529-4531.

Mehta, Preeti, et al., Study of Mixed Ligand Complexes of Nickel(II), Copper(II), Palladium(II) and Platinum(II) with Pyrrole-2-carboxaldehyde and Acetylacetone, *J. Indian Chem. Soc.* vol. XLI Jul. 1984, 571-572.

Pucci, Daniela, et al., Unsuspected mesomorphism in "tail-free" cyclopalladated 3,5-disubstituted-2-(2'-pyridyl)pyrroles, *Chem. Commun*, 2009, 1550-1552.

Yokoi, H., et al., Spectroscopic and Redox Properties of Pseudotetrahedral Copper(II) Complexes, Their Relationship to Copper Proteins, *Inorganic Chemistry* vol. 16 No. 6 1977, 1341-1349.

Yoshida, Yasunori, et al., New Titanium Complexes Having Two Pyrrolide-Imine Chelate Ligands: Synthesis, Structures, and Ethylene Polymerization Behavior, *Organometallics* vol. 20 2001, 4793-4799.

\* cited by examiner

METHOD OF ATOMIC LAYER DEPOSITION USING METAL PRECURSORS

CROSS REFERENCE PARAGRAPH

This application claims priority to U.S. Provisional Application Nos. 61/510,604, filed Jul. 22, 2011, and 61/581,695, filed Dec. 30, 2011, the contents of which are hereby incorporated by reference in their entirety.

PARTIES TO A JOINT RESEARCH AGREEMENT

The subject matter of this application arises in part from a joint research agreement between Applied Materials, Inc. a Delaware corporation, and L'Air Liquide S.A., a French corporation.

TECHNICAL FIELD

The present invention relates generally to methods of depositing thin films and to metal coordination complexes useful in such methods. In particular, the invention relates to the use of coordination complexes for the deposition of films consisting essentially of Co, Mn, Ru or a lanthanide.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect structures. One method for deposition of thin films with atomic layer control and conformal deposition is atomic layer deposition (ALD), which employs sequential, self-limiting surface reactions to form layers of precise thickness controlled at the Ångstrom or monolayer level. Most ALD processes are based on binary reaction sequences which deposit a binary compound film. Each of the two surface reactions occurs sequentially, and because they are self-limiting, a thin film can be deposited with atomic level control. Because the surface reactions are sequential, the two gas phase reactants are not in contact, and possible gas phase reactions that may form and deposit particles are limited. The self-limiting nature of the surface reactions also allows the reaction to be driven to completion during every reaction cycle, resulting in films that are continuous and pinhole-free.

ALD has been used to deposit metals and metal compounds on substrate surfaces. $Al_2O_3$ deposition is an example of a typical ALD process illustrating the sequential and self-limiting reactions characteristic of ALD. $Al_2O_3$ ALD conventionally uses trimethylaluminum (TMA, often referred to as reaction "A" or the "A" precursor) and $H_2O$ (often referred to as the "B" reaction or the "B" precursor). In step A of the binary reaction, hydroxyl surface species react with vapor phase TMA to produce surface-bound $AlOAl(CH_3)_2$ and $CH_4$ in the gas phase. This reaction is self-limited by the number of reactive sites on the surface. In step B of the binary reaction, $AlCH_3$ of the surface-bound compound reacts with vapor phase $H_2O$ to produce AlOH bound to the surface and $CH_4$ in the gas phase. This reaction is self-limited by the finite number of available reactive sites on surface-bound $AlOAl(CH_3)_2$. Subsequent cycles of A and B, purging gas phase reaction products and unreacted vapor phase precursors between reactions and between reaction cycles, produces $Al_2O_3$ growth in an essentially linear fashion to obtain the desired film thickness.

While perfectly saturated monolayers are often desired, this goal is very difficult to achieve in practice. The typical approach to further ALD development has been to determine whether or not currently available chemistries are suitable for ALD. Prior art processes for ALD have been most effective for deposition of metal oxide and metal nitride films. Although a few processes have been developed that are effective for deposition of some late transition metals, in general ALD processes for deposition of pure metal have not been sufficiently successful to be adopted commercially. There is a need for new deposition chemistries that are commercially available, particularly in the area of elemental metal films. The present invention addresses this problem by providing novel chemistries which are specifically designed and optimized to take advantage of the atomic layer deposition process. In fact, before the present invention, there were no commercially available atomic layer deposition precursors that are capable of producing thin films of elemental cobalt, manganese or ruthenium. For example, there are known methods of depositing thin manganese metal films via physical deposition methods in back end of the line processes. However, the thin metal films deposited this way have been shown to migrate to $SiO_2$ interfaces. This forms manganese oxide, which acts as a barrier layer and prevents copper diffusion. Better precursors for the ALD of cobalt, manganese, ruthenium or a lanthanide are desired.

SUMMARY

Embodiments of the invention provide methods for producing thin films consisting essentially of cobalt, manganese and/or ruthenium on a substrate using metal coordination complexes as source material. The thin films may be produced using atomic layer deposition (ALD) processes, including plasma enhanced atomic layer deposition (PEALD) processes.

In one aspect, the invention relates to a method of depositing a metal layer by atomic layer deposition, the method comprising contacting a surface of a substrate with a vapor phase metal coordination complex having a structure represented by:

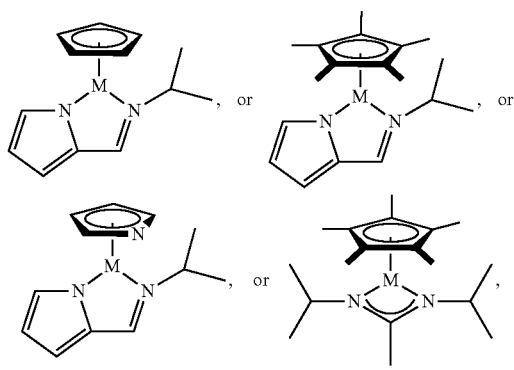

wherein M is Co, Mn, Ru or a lanthanide, such that a layer is formed on the surface comprising the metal coordination complex bound to the surface by the metal; and contacting the bound metal complex with a reducing agent such that an exchange reaction occurs between the bound metal coordination complex and the reducing agent, thereby dissociating the bound metal complex and producing a first layer consisting essentially of Co, Mn, Ru or a lanthanide on the surface of the substrate. In a further embodiment, M is selected from La, Pr, Tb, and Gd.

In another aspect, the invention relates to a method of depositing a metal layer consisting essentially of Co, Mn, Ru or a lanthanide by atomic layer deposition, the method comprising contacting a surface of a substrate with a vapor phase metal coordination complex having a structure represented by:

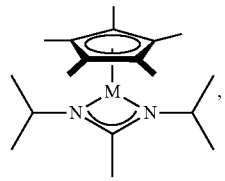

wherein M is Co, Mn, Ru or a lanthanide, such that a layer is formed on the surface comprising the metal coordination complex bound to the surface by the metal; and contacting the bound metal complex with a reducing agent such that an exchange reaction occurs between the bound metal coordination complex and the reducing agent, thereby dissociating the bound metal complex and producing a first layer consisting essentially of Co, Mn, Ru or a lanthanide on the surface of the substrate. In a further embodiment, M is selected from La, Pr, Tb, and Gd.

A method of forming a metal layer consisting essentially of Co, Mn, Ru or a lanthanide on a substrate surface, the method comprising: during an atomic layer deposition process, exposing a substrate to a vapor phase metal coordination complex having a formula represented by the structure

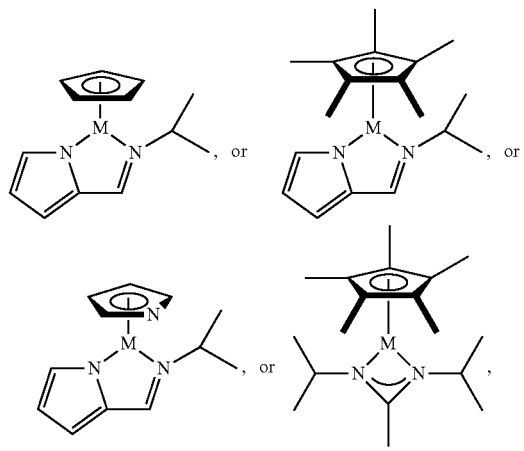

or combinations thereof, wherein M is Co, Mn, Ru or a lanthanide, such that a layer is formed on the surface comprising the metal coordination complex bound to the surface by the metal; during an atomic layer deposition process, exposing the substrate having bound metal complex with a reducing agent such that an exchange reaction occurs between the bound metal coordination complex and the reducing agent, thereby dissociating the bound metal complex and producing a first layer consisting essentially of Co, Mn, Ru or a lanthanide on the surface of the substrate; and sequentially repeating the atomic layer deposition process and the treatment. In a further embodiment, M is selected from La, Pr, Tb, and Gd.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways. It is also to be understood that the complexes and ligands of the present invention may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

The term "metal coordination complex" as used herein is used interchangeably with "metal complex" and "coordination complex," and includes structures that consist of a central metal atom bonded to one or more ligands. As will be discussed in more detail below, the metal complexes of the invention comprise of ligands eta-3 bonded to metals.

In one aspect of the invention, the precursor for ALD contains a 2-methyliminopyrrolyl ligand (PCAI-iPr) having a structure represented by formula (I):

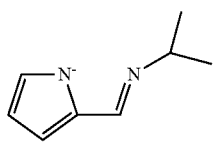

Thus, the precursors useful for forming the metal coordination complex may be one of four related compounds, having a structure represented by formula (II):

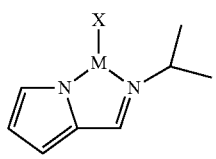

wherein M is a metal, and X is a cylcopentadienyl (Cp), 1,2,3,4,5-pentamethylcylcopentadiene (Cp*), or eta5-pyrrolyl ligand. M may be Co, Mn, Ru or a lanthanide. In a further embodiment, M is selected from La, Pr, Tb, and Gd.

Therefore, in three embodiments, the precursor may have a structure represented by formula (III):

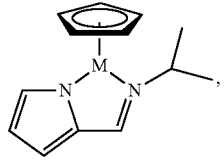

formula (IV):

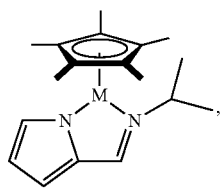

formula (V):

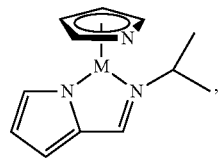

wherein M is a Co, Mn, Ru or a lanthanide. In a further embodiment, M is selected from La, Pr, Tb, and Gd.

A second aspect of the invention relates to another precursor for the ALD of Co, Mn, Ru or a lanthanide. The precursor comprises a metal coordination complex with Cp* and N,N'-diisopropylformamidinato ligands. This precursor has a structure represented by formula (VI):

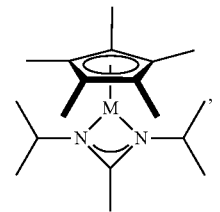

wherein M is Co, Mn, Ru or a lanthanide. In a further embodiment, M is selected from La, Pr, Tb, and Gd.

All of the precursors can be used to deposit films consisting essentially of Co, Mn, Ru or a lanthanide. These precursors show desirable vapor pressure and thermal properties.

In one or more embodiments of the invention, the process for preparing thin films consisting essentially of Co, Mn, Ru or a lanthanide is an ALD process. A specific embodiment relates to a method of depositing metal by atomic layer deposition, the method comprising: contacting a surface of a substrate with a vapor phase metal coordination complex having a structure represented by:

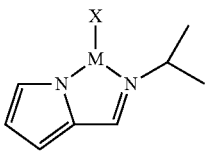

wherein M is Co, Mn, Ru or a lanthanide, and X is a ligand selected from the group consisting of Cp, Cp*, and eta 5-pyrrolyl, such that a layer is formed on the surface comprising the metal coordination complex bound to the surface by the metal; and contacting the bound metal complex with a reducing agent such that an exchange reaction occurs between the bound metal coordination complex and the reducing agent, thereby dissociating the bound metal complex and producing a first layer consisting essentially of Co, Mn, Ru or a lanthanide on the surface of the substrate. In a further embodiment, M is selected from La, Pr, Tb, and Gd.

Another aspect of the invention is a method of depositing a metal layer consisting essentially of Co, Mn, Ru or a lanthanide by atomic layer deposition, the method comprising contacting a surface of a substrate with a vapor phase metal coordination complex having a structure represented by:

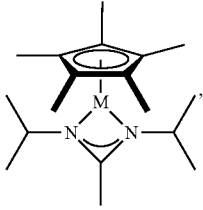

wherein M is Co, Mn, Ru or a lanthanide, such that a layer is formed on the surface comprising the metal coordination complex bound to the surface by the metal; and contacting the bound metal complex with a reducing agent such that an exchange reaction occurs between the bound metal coordination complex and the reducing agent, thereby dissociating the bound metal complex and producing a first layer consisting essentially of Co, Mn, Ru or a lanthanide on the surface of the substrate. The vapor phase metal complex may be in a mixture with an inert gas. The substrate may be a semiconductor wafer. The reducing agent can include, but is not limited to hydrogen gas, ammonia, hydrazines, $N_2$ plasma, $H_2$ plasma, Ar plasma ammonia plasma and combinations thereof. In a further embodiment, the method further comprises purging excess unreacted vapor phase metal complex with an inert gas prior to addition of the reducing agent. In further embodiments, M is selected from La, Pr, Tb, and Gd.

An illustrative example of such a process begins when the metal coordination complex is vaporized, optionally in a mixture with an inert carrier gas, and flowed in the vapor phase to a substrate within a deposition chamber. The substrate has a surface that is appropriate for adsorption of the metal coordination complex to the surface via the metal ion when the carbonyl ligands dissociate from the complex, exposing an active site for bonding with the surface. In one embodiment, the substrate used is a semiconductor wafer. In this example, the surface for adsorption may be bare metal. The surface is exposed to the metal coordination complex for sufficient time to permit adsorption of the complex in a layer on the surface. A reducing gas is then flowed into the deposition chamber to reduce the bond(s) in the ligand, releasing the ligand from the metal center and leaving an atomic layer consisting essentially of Co, Mn, Ru or a lanthanide on the substrate. In one embodiment, the reducing gas used is hydrogen. In another embodiment, the process also includes purging excess unreacted vapor phase metal complex with an inert gas prior to addition of the reducing gas. In yet another embodiment, the vapor phase metal complex is in a mixture with an inert gas In another embodiment, a method of forming a layer consisting essentially of Co, Mn, Ru or a lanthanide on a substrate surface comprises: during an atomic layer deposition process, exposing a substrate to a vapor phase metal coordination complex having the formula (III), (IV), (V) or (VI), such that a layer is formed on the surface comprising the metal coordination complex bound to the surface by the metal atom; during an atomic layer deposition process, exposing the substrate having bound metal complex with a reducing agent such that an exchange reaction occurs between the bound metal coordination complex and the reducing agent, thereby dissociating the bound metal complex and producing a first layer consisting essentially of Co, Mn, Ru or a lanthanide on the surface of the substrate; and sequentially repeating the atomic layer deposition process and the treatment. This metal may be Co, Mn, Ru or a lanthanide. In a further embodiment, the lanthanide is selected from La, Pr, Tb, and Gd.

Another embodiment of the invention relates to a method of forming a metal layer consisting essentially of Co, Mn, Ru or a lanthanide on a substrate surface, comprising: (a) disposing a substrate within a process chamber; (b) flowing a vapor phase metal coordination complex having the formula (III), (IV), (V) or (VI), such that a layer is formed on the surface comprising the metal coordination complex bound to the surface by the metal; (c) purging the process chamber; (d) flowing a reducing agent such that an exchange reaction occurs between the bound metal coordination complex and the reducing agent, thereby dissociating the bound metal complex and producing a first layer consisting essentially of Co, Mn, Ru or a lanthanide on the surface of the substrate; (e) purging the process chamber; repeating (a) through (e). In a further embodiment, the lanthanide is selected from La, Pr, Tb, and Gd.

Optionally, a second atomic layer of metal may be formed added on the first atomic layer by repeating the process of the reaction cycle. Hydrogen remaining from the preceding reduction reaction is purged from the deposition chamber using an inert gas and a metal coordination complex in vapor phase is again flowed into the chamber into contact with the metal film on the substrate surface. An exchange reaction occurs between the metal coordination complex in the vapor phase and hydrogen atoms on the metal of the first atomic layer. This displaces one of the ligands from the vapor phase metal coordination complex and leaves the metal atom of the metal coordination complex bound to the metal atom of the first atomic layer. The reaction time, temperature and pressure are selected to create a metal-surface interaction and form a layer on the surface of the substrate. Unreacted vapor phase metal coordination complex and released ligand are purged from the deposition chamber using an insert gas. A reducing agent is flowed into the deposition chamber to reduce the bond(s) between the metal and any remaining ligand(s), releasing the remaining ligand(s) from the metal center and producing a second atomic layer consisting essentially of Co, Mn, Ru or a lanthanide on the first atomic layer consisting essentially of Co, Mn, Ru or a lanthanide. In a further embodiment, the lanthanide is selected from La, Pr, Tb, and Gd.

In one embodiment, a second layer of metal may be added by contacting the first layer consisting essentially of Co, Mn, Ru or a lanthanide on the substrate surface with the vapor phrase metal coordination complex such that an exchange reaction occurs between the metal complex and the first layer, thereby partially dissociating the metal complex and producing a second layer on the surface comprising the partially dissociated metal complex bound to the first layer by the metal; and contacting the bound metal complex of the second layer with a reducing agent such that an exchange reaction occurs between the bound metal complex and the reducing agent, thereby dissociating the bound metal complex and producing a second layer consisting essentially of Co, Mn, Ru or a lanthanide on the surface of the substrate. Additional repetitions of the deposition cycle may be used to build a layer consisting essentially of Co, Mn, Ru or a lanthanide of the desired thickness. In a further embodiment, the lanthanide is selected from La, Pr, Tb, and Gd.

In an alternative aspect of the ALD deposition methods of the invention the substrate has a surface that is activated for reaction with the metal coordination complex to form a first layer on the substrate. A metal coordination complex according to the invention is vaporized and flowed in the vapor phase to a substrate within a deposition chamber. The metal atom becomes bound to the surface. The reaction time, temperature and pressure are selected to create a metal-surface interaction and achieve a layer on the surface of the substrate. The first layer comprises the metal bound to the surface and coordinated with at least one ligand. Following formation of the first monolayer, precursor gas containing unreacted metal coordination complex and released ligand are purged from the deposition chamber using an inert gas. A reducing agent is then flowed into the deposition chamber to reduce the remaining bond(s) between the metal and the ligand(s) of the coordination complex, releasing the remaining ligand(s) from the metal center and leaving an atomic layer consisting essentially of Co, Mn, Ru or a lanthanide on the substrate. The reducing agent may be of hydrogen gas, ammonia, hydrazines, $N_2$ plasma, $H_2$ plasma, Ar plasma ammonia plasma and combinations thereof. In a further embodiment, the lanthanide is selected from La, Pr, Tb, and Gd.

As in the adsorption ALD process discussed above, a second atomic layer consisting essentially of Co, Mn, Ru or a lanthanide may optionally be formed on the first atomic layer by repeating the process of the reaction cycle. Hydrogen remaining from the preceding reduction reaction is purged from the deposition chamber using an inert gas and a metal coordination complex in vapor phase is again flowed into the chamber into contact with the metal film on the substrate surface. An exchange reaction occurs between the metal coordination complex in the vapor phase and hydrogen atoms on the metal of the first atomic layer. This displaces one of the ligands from the vapor phase metal coordination complex, reducing the displaced ligand and leaving the metal atom of the metal coordination complex bound to the metal atom of the first atomic layer. The reaction time, temperature and pressure are selected to achieve a uniform layer on the surface of the substrate. Unreacted vapor phase metal coordination complex and released ligands are purged from the deposition chamber using an insert gas. A reducing agent is flowed into the deposition chamber to reduce the bond(s) between the metal and any remaining ligand(s), releasing the remaining ligand(s) from the metal center and producing a second uniform atomic layer consisting essentially of Co, Mn, Ru or a lanthanide on the first atomic layer. Additional repetitions of the deposition cycle may be used to build a composite film consisting essentially of Co, Mn, Ru or a lanthanide of the desired thickness. In a further embodiment, the lanthanide is selected from La, Pr, Tb, and Gd.

The substrate for deposition of one or more embodiments of the thin layer films described herein may be any substrate suitable for conformal film coating in an ALD or CVD process. Such substrates include silicon, silica or coated silicon, metal, metal oxide and metal nitride. In one aspect of the invention, the substrate is a semiconductor substrate.

The reaction conditions for the ALD reaction will be selected based on the properties of the selected metal coordination complex. The deposition can be carried out at atmospheric pressure but is more commonly carried out at a reduced pressure. The vapor pressure of the metal coordination complex should be low enough to be practical in such applications. The substrate temperature should be low enough to keep the bonds between the metal atoms at the surface intact and to prevent thermal decomposition of gaseous reactants. However, the substrate temperature should also be high enough to keep the source materials (i.e., the reactants) in the gaseous phase and to provide sufficient activation energy for the surface reaction. The appropriate temperature depends on the specific metal coordination complex used and the pressure. The properties of a specific metal coordination complex for use in the ALD deposition methods of the invention can be evaluated using methods known in the art, allowing selection of appropriate temperature and pressure for the reaction. In general, lower molecular weight and the presence of functional groups that increase the rotational entropy of the ligand sphere result in a melting point that yields liquids at typical delivery temperatures and increased vapor pressure.

An optimized metal coordination complex with a structure of formulas (III) through (VI) for use in the deposition methods of the invention will have all of the requirements for sufficient vapor pressure, sufficient thermal stability at the selected substrate temperature and sufficient reactivity to produce a self-limiting reaction on the surface of the substrate without unwanted impurities in the thin film or condensation. Sufficient vapor pressure ensures that molecules of the source compound are present at the substrate surface in sufficient concentration to enable a complete self-saturating reaction. Sufficient thermal stability ensures that the source compound will not be subject to the thermal decomposition which produces impurities in the thin film.

Another aspect of the invention pertains to an apparatus for deposition of a film on a substrate to perform a process according to any of the embodiments described above. In one embodiment, the apparatus comprises a deposition chamber for atomic layer deposition of a film on a substrate. The chamber comprises a process area for supporting a substrate. The apparatus includes a precursor inlet in fluid communication with a supply of metal precursor. The apparatus also includes a reactant gas inlet in fluid communication with a supply of a reducing agent, as discussed above. The apparatus further includes a purge gas inlet in fluid communication with a purge gas. The apparatus can further include a vacuum port for removing gas from the deposition chamber. The apparatus can further include an auxiliary gas inlet for supplying one or more auxiliary gases such as inert gases to the deposition chamber. The deposition can further include a means for heating the substrate by radiant and/or resistive heat.

EXAMPLE

In this prophetic example, a metal complex precursor having a structure represented by formula (VI):

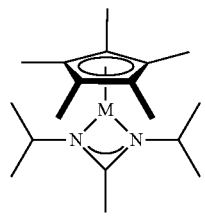

wherein M is Mn, is used to deposit a film via an atomic layer deposition (ALD) process. The chemical precursor is in a state of gas, and is pulsed to the substrate surface in a first half reaction. The precursor reacts with suitable underlying OH functionality on the substrate surface to form a new self-saturating surface. Excess unused reactants and the reaction by-products are removed by a flowing inert purge gas. During the purge, an inert gas is introduced into the processing chamber to purge the reaction zone or otherwise remove any residual reactive compound or by-products from the reaction zone.

Then a reducing agent, hydrogen gas, is delivered to the surface, wherein the previously reacted terminating substituents or ligands of the first half reaction are reacted such that an exchange reaction occurs between the bound metal coordination complex and the reducing agent, thereby dissociating the bound metal complex and producing a first layer consisting essentially of Co, Mn, Ru or a lanthanide on the surface of the substrate.

A second purge period is utilized to remove unused reactants and the reaction by-products. The resulting film contains one atomic monolayer consisting essentially of Co, Mn, Ru or a lanthanide, which is highly conformal.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of depositing a metal layer consisting essentially of Co, Mn, Ru or a lanthanide by atomic layer deposition, the method comprising:

contacting a surface of a substrate with a vapor phase metal coordination complex having a structure represented by:

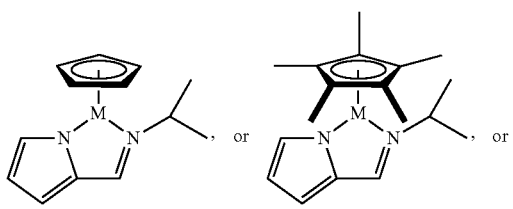

combinations thereof, wherein M is Co, Mn, Ru or a lanthanide; and contacting the bound metal complex with a reducing agent such that an exchange reaction occurs between the bound metal coordination complex and the reducing agent, thereby dissociating the bound metal complex and producing a first layer consisting essentially of Co, Mn, Ru or a lanthanide on the surface of the substrate.

2. The method of claim 1, wherein the metal coordination complex has a structure represented by

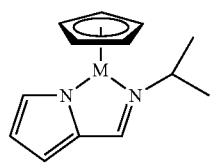

wherein M is Co, Mn, Ru or a lanthanide.

3. The method of claim 1, wherein the metal coordination complex has a structure represented by

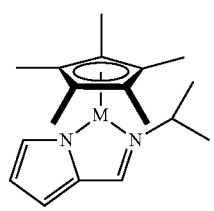

wherein M is Co, Mn, Ru or a lanthanide.

4. The method of claim 1, wherein the metal coordination complex has a structure represented by

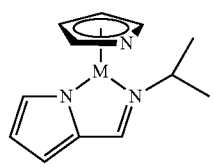

wherein M is Co, Mn, Ru or a lanthanide.

5. The method of claim 1, wherein the lanthanide is selected from La, Pr, Tb, and Gd.

6. The method of claim 1, wherein the reducing agent is selected from the group consisting of hydrogen gas, ammonia, hydrazines, $N_2$ plasma, $H_2$ plasma, Ar plasma, ammonia plasma and combinations thereof.

7. The method of claim 1, further comprising purging excess unreacted vapor phase metal complex with an inert gas prior to addition of the reducing agent.

8. The method of claim 1, wherein the vapor phase metal complex is in a mixture with an inert gas.

9. The method of claim 1, the method further comprising:
a. contacting the first layer on the substrate surface with the vapor phrase metal coordination complex such that an exchange reaction occurs between the metal complex and the first layer metal, thereby partially dissociating the metal complex and producing a second layer on the surface comprising the partially dissociated metal complex bound to the first layer by the metal; and
b. contacting the bound metal complex of the second layer with a reducing agent such that an exchange reaction occurs between the bound metal complex and the reducing agent, thereby dissociating the bound metal complex and producing a second layer consisting essentially of Co, Mn, Ru or a lanthanide on the surface of the substrate.

10. A method of depositing a metal consisting essentially of Co, Mn, Ru or a lanthanide by atomic layer deposition, the method comprising:

contacting a surface of a substrate with a vapor phase metal coordination complex having a structure represented by:

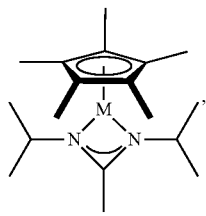

wherein M is Co, Mn, Ru or a lanthanide, such that a layer is formed on the surface comprising the metal coordination complex bound to the surface by the metal; and contacting the bound metal complex with a reducing agent such that an exchange reaction occurs between the bound metal coordination complex and the reducing agent, thereby dissociating the bound metal complex and producing a first layer consisting essentially of Co, Mn, Ru or a lanthanide on the surface of the substrate.

11. The method of claim 10, wherein the lanthanide is selected from La, Pr, Tb, and Gd.

12. The method of claim 10, wherein the reducing agent is selected from the group consisting of hydrogen gas, ammonia, hydrazines, $N_2$ plasma, $H_2$ plasma, Ar plasma, ammonia plasma and combinations thereof.

13. The method of claim 10, further comprising purging excess unreacted vapor phase metal complex with an inert gas prior to addition of the reducing agent.

14. The method of claim 10, wherein the vapor phase metal complex is in a mixture with an inert gas.

15. The method of claim 10, the method further comprising:

contacting the first layer on the substrate surface with the vapor phrase metal coordination complex such that an exchange reaction occurs between the metal complex and the first layer, thereby partially dissociating the metal complex and producing a second layer on the surface comprising the partially dissociated metal complex bound to the first layer by the metal; and contacting the bound metal complex of the second layer with a reducing agent such that an exchange reaction occurs between the bound metal complex and the reducing agent, thereby dissociating the bound metal complex and producing a second layer consisting essentially of Co, Mn, Ru or a lanthanide on the surface of the substrate.

16. A method of forming a metal layer on a substrate surface, the method comprising:

during an atomic layer deposition process, exposing a substrate to a vapor phase metal coordination complex having a formula represented by the structure

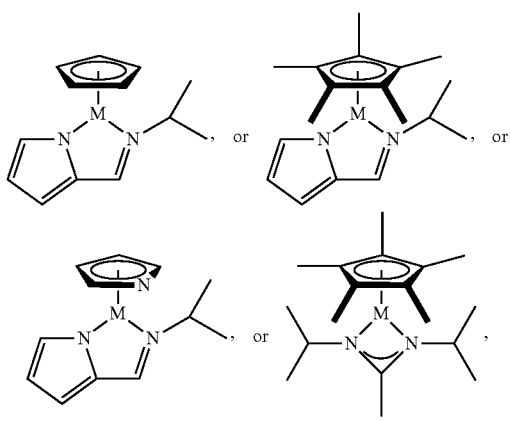

wherein M is Co, Mn, Ru or a lanthanide, such that a layer is formed on the surface comprising the metal coordination complex bound to the surface by the metal;
during an atomic layer deposition process, exposing the substrate having bound metal complex with a reducing agent such that an exchange reaction occurs between the bound metal coordination complex and the reducing agent, thereby dissociating the bound metal complex and producing a first layer consisting essentially of Co, Mn, Ru or a lanthanideon the surface of the substrate; and sequentially repeating the atomic layer deposition process and the treatment.

17. The method of claim 16, wherein the metal coordination complex has a structure represented by

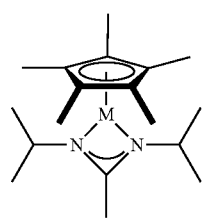

wherein M is Co, Mn, Ru or a lanthanide.

18. The method of claim 16, wherein the metal coordination complex has a structure represented by

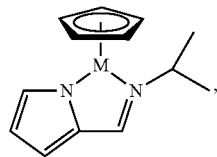

wherein M is Co, Mn, Ru or a lanthanide.

19. The method of claim 16, wherein the metal coordination complex has a structure represented by

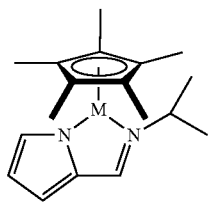

wherein M is Co, Mn, Ru or a lanthanide.

20. The method of claim 16, wherein the metal coordination complex has a structure represented by

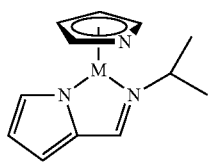

wherein M is Co, Mn, Ru or a lanthanide.

* * * * *

UNITED STATES PATENT AND TRADEMARK OFFICE
CERTIFICATE OF CORRECTION

| | | |
|---|---|---|
| PATENT NO. | : 8,906,457 B2 | Page 1 of 1 |
| APPLICATION NO. | : 13/549910 | |
| DATED | : December 9, 2014 | |
| INVENTOR(S) | : David Thompson et al. | |

It is certified that error appears in the above-identified patent and that said Letters Patent is hereby corrected as shown below:

In the Claims

Col. 10, lines 56-66 - the following text and structure should be inserted before ", or combinations thereof".

-- , or 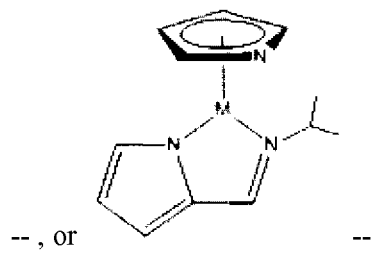 --

Signed and Sealed this
Eighteenth Day of August, 2015

Michelle K. Lee
*Director of the United States Patent and Trademark Office*